United States Patent [19]

Kong

[11] Patent Number: 5,506,752
[45] Date of Patent: Apr. 9, 1996

[54] APPARATUS FOR COOLING AN INTEGRATED CIRCUIT CHIP

[76] Inventor: Edmund Y. Kong, 3590 Finch Pl., Fremont, Calif. 94555

[21] Appl. No.: 279,960

[22] Filed: Jul. 25, 1994

[51] Int. Cl.⁶ .................................... H05K 7/20
[52] U.S. Cl. .................. 361/695; 165/122; 257/718; 257/727; 361/704
[58] Field of Search ............... 24/457, 458, 555; 248/505, 510; 165/122, 126, 80.3; 257/707, 712, 713, 718, 721, 722, 727; 361/689, 690, 694, 695, 697, 717–719, 722, 760, 764, 704, 707

[56] References Cited

U.S. PATENT DOCUMENTS

| | | |
|---|---|---|
| 4,682,651 | 7/1987 | Gabuzda . |
| 4,885,488 | 12/1989 | Cox . |
| 5,166,775 | 11/1992 | Bartilson . |
| 5,251,101 | 10/1993 | Liu . |
| 5,288,203 | 2/1994 | Thomas . |
| 5,353,863 | 10/1994 | Yu ........................................ 165/80.3 |
| 5,368,094 | 11/1994 | Hung ..................................... 165/80.3 |
| 5,409,352 | 4/1995 | Lin ......................................... 415/177 |

*Primary Examiner*—Gerald P. Tolin
*Attorney, Agent, or Firm*—Flehr, Hohbach, Test, Albritton & Herbert

[57] ABSTRACT

An apparatus for cooling an integrated circuit chip that comprises an air movement device, a plurality of mounting clips, and a plurality of fasteners. The mounting clips are for clipping the air movement device onto the integrated circuit chip. The fasteners fix the mounting clips to the air movement device. In addition, these fasteners have heads that provide spacing between the air movement device and the integrated circuit chip when the air movement device is clipped onto the integrated circuit chip by the mounting clips. This allows air to be moved over the integrated circuit chip by the air movement device in order to cool the integrated circuit chip.

4 Claims, 4 Drawing Sheets

5,506,752

APPARATUS FOR COOLING AN INTEGRATED CIRCUIT CHIP

The present invention relates to cooling of integrated circuit (IC) chips. More particularly this invention relates to an IC chip cooling apparatus that includes an air movement device that is clipped onto but spaced from an integrated circuit chip for moving air over the integrated circuit chip in order to cool it.

BACKGROUND OF THE INVENTION

Conventional IC chip cooling apparatuses typically include a fan assembly and a heat sink. In operation, the heat sink is fixed to the upper surface of the IC chip with the fan assembly being fixed to and located over the heat sink. The heat sink is used to dissipate heat from the IC chip so as to cool it. Moreover, the fan assembly includes a fan having fan blades for moving air over the heat sink and is intended to further aid in the dissipation of the heat from the IC chip. However, there are several problems associated with these conventional cooling apparatuses.

Specifically, many of the conventional cooling apparatuses utilize large mounting clips for mounting the heat sink and fan assembly onto the IC chip. Others utilize epoxy for gluing the heat sink and fan assembly onto the IC chip. Moreover, the entire cooling apparatus has a large height since it includes both a heat sink and fan assembly. As a result of these factors, the IC chip must be removed from the printed circuit board to which it is attached so that the cooling apparatus can be mounted onto the IC chip. This makes installation of these types of cooling apparatuses cumbersome and therefore increases the time and cost of installation.

Furthermore, as indicated earlier, the heat sinks employed by the conventional cooling apparatuses are intended to further aid in the dissipation of the heat from the IC chip. However, these heat sinks are expensive and therefore increase the cost of the cooling apparatuses. Also, as alluded to earlier, these heat sinks are bulky and make the height of the cooling apparatus rather large so that the cost of installing the cooling apparatus is increased. Moreover, the intended effect of the heat sinks is diminished by the fact that they do not allow for air to be directly moved over the upper surface of the IC chip for dissipating heat from the IC chip.

SUMMARY OF THE INVENTION

The foregoing problems are cured by an apparatus for cooling an integrated circuit chip that comprises an air movement device, a plurality of mounting clips, and a plurality of fasteners. The mounting clips are for clipping the air movement device onto the integrated circuit chip. The fasteners fix the mounting clips to the air movement device. In addition, these fasteners have heads that provide spacing between the air movement device and the integrated circuit chip when the air movement device is clipped onto the integrated circuit chip by the mounting clips. This allows air to be moved over the integrated circuit chip by the air movement device in order to cool the integrated circuit chip.

BRIEF DESCRIPTION OF THE DRAWINGS

The invention will be more readily apparent from the following detailed description and appended claims when taken in conjunction with the drawings, in which:

DETAILED DESCRIPTION OF THE INVENTION

Figure 1:
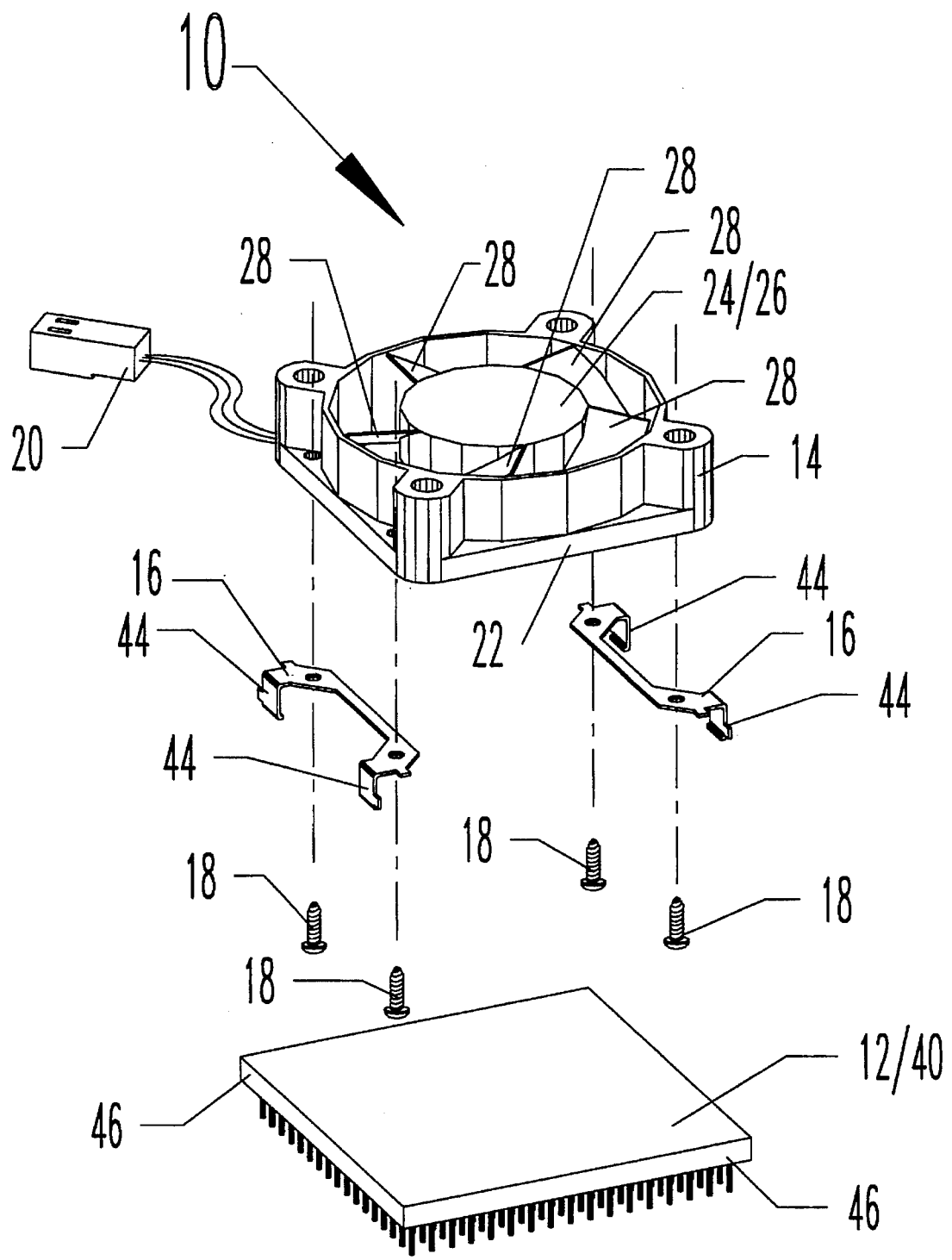
FIG. 1 is an exploded view of a IC chip cooling apparatus in accordance with the present invention.

Referring to FIG. 1, there is shown an exploded view of a IC chip cooling apparatus 10 for cooling an IC chip 12 in accordance with the present invention. Cooling apparatus 10 includes a fan assembly 14, mounting clips 16, fasteners 18, and a power line 20.

The fan assembly 14 includes a fan support frame 22 and a fan 24. The fan 24 includes a fan body 26 and fan blades 28 integrally joined to the fan body 26.

Figure 2:
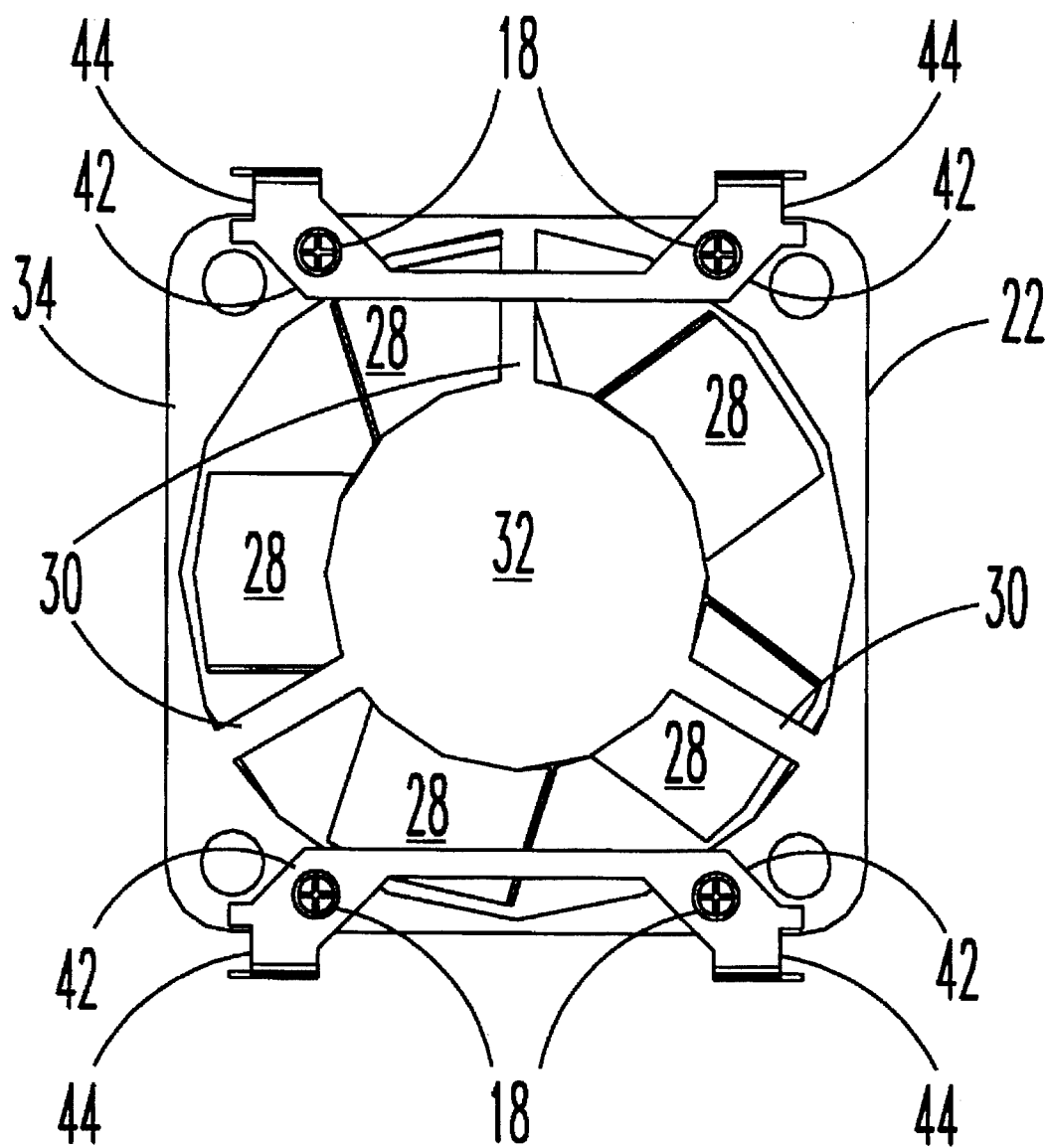
FIG. 2 is a bottom view of the cooling apparatus of FIG. 1.

As shown in FIG. 2, the fan support frame 22 includes struts 30 and a support base 32. The struts 30 connect the support base 32 to the rest of the fan support frame 22. The fan body 26 shown in FIG. 1 is rotatably attached to and supported by the support base 32 so that the fan blades 28 will move or circulate air when the fan assembly is energized by the power line 20.

Moreover, those skilled in the art will appreciate that cooling apparatus 10 may employ other types of conventional air movement devices instead of fan assembly 14 for moving or circulating air.

Referring again to FIG. 2, the mounting clips 16 are fixed to the bottom surface 34 of the support frame 22 by the fasteners 18.

Figure 3A:
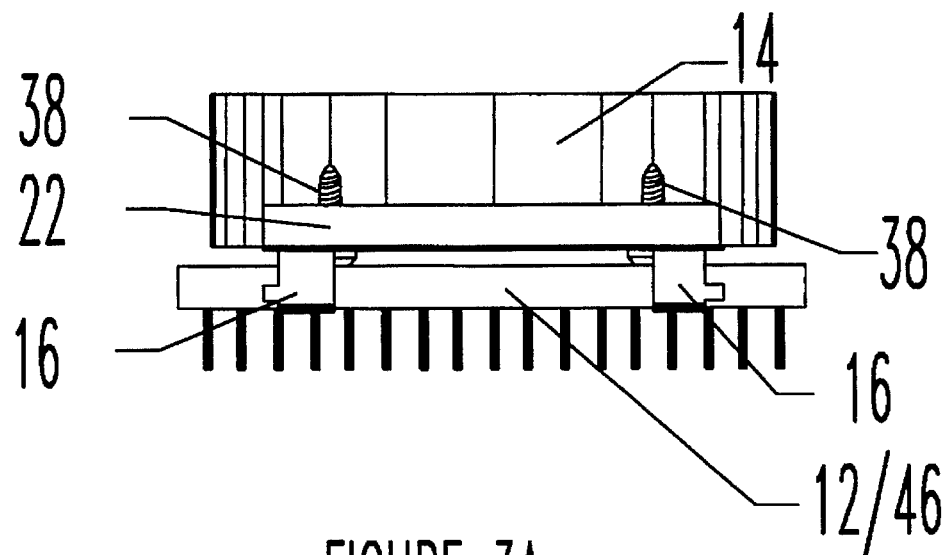
FIGS. 3a and 3b are side views of the cooling apparatus of FIG. 1 when clipped onto an IC chip.
Figure 3B:
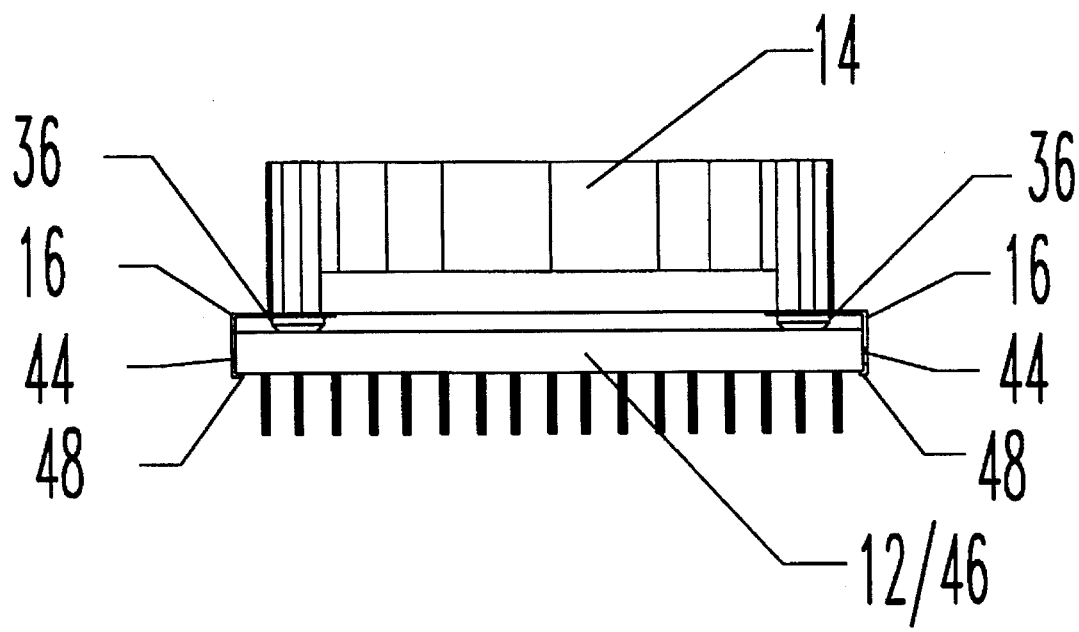
Figure 4:
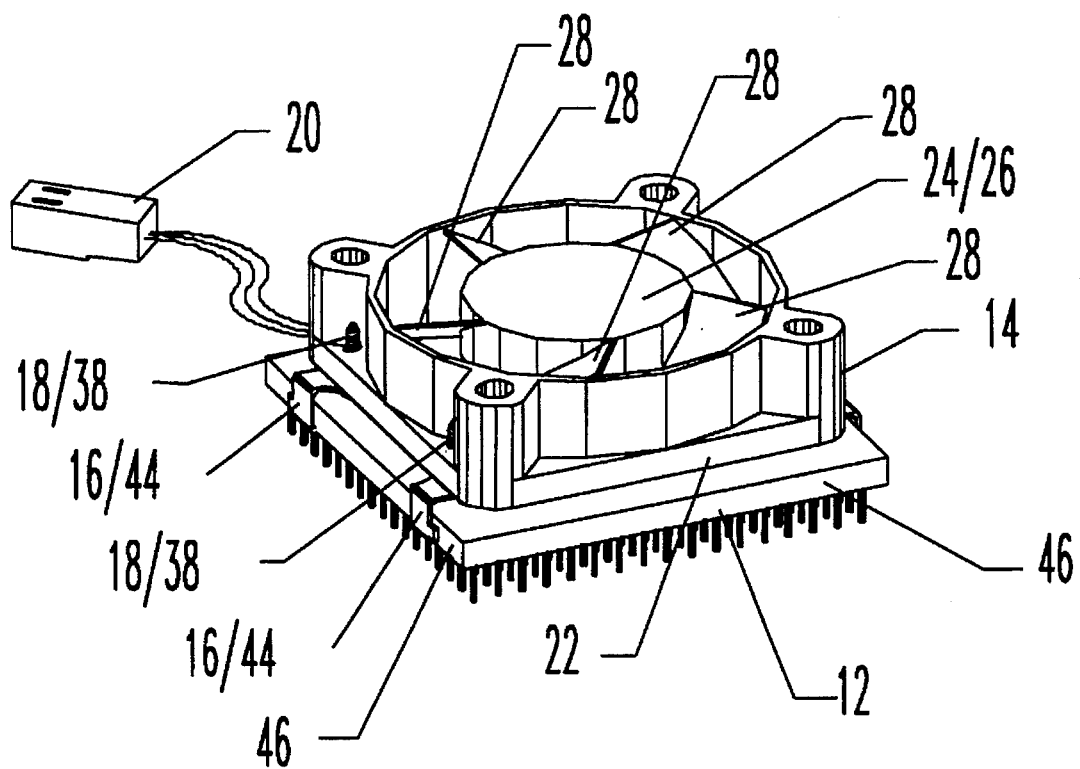
FIG. 4 is a perspective view of the cooling apparatus of FIG. 1 when clipped onto an IC chip.

As shown in FIGS. 3a and 4, the trunks 38 of the fasteners 18 extend into the support frame 22 of the fan assembly 14 for fastening the mounting clips 16 to the fan assembly 14. Furthermore, when the fan assembly 14 is clipped onto the IC chip 12, the heads 36 of the fasteners 18 provide spacing between the upper surface 40 of the IC chip 12 and the fan assembly 14 as shown in FIG. 3b. Thus, the fasteners 18 both fix the mounting clips 16 to the fan assembly 14 and provide spacing between the upper surface 40 of the IC chip 12 and the fan assembly 14.

The fasteners 18 may be metal or plastic screws, bolts and nuts, rivets, or other similar items that have trunks that are screwed into or extend into the fan assembly for fastening purposes and have heads that provide spacing of the type just described.

When the fan assembly 14 is energized by the power line 20, the spacing provided by the fasteners 18 enables the fan blades 28 to adequately move or circulate air over and across the upper surface 40 of the IC chip 12. This dissipates the heat from the IC chip 12 and cools it.

Referring again to FIGS. 1 and 2, each of the mounting clips 18 is made of a flexible metallic, plastic, or similar material. Furthermore, each mounting clip 18 has a base portion 42 and a holding portion 44. Each of the base portions 42 is fixed to the fan assembly 14 at the bottom surface 34 of the support frame 22 with fasteners 18. Each of the holding portions 44 is integrally joined with a base portion 42.

Each holding portion 44 is C shaped so that it can extend around one of the side surfaces 46 of the IC chip 12 and contact the lower surface 48 of the IC chip 12 for clipping the fan assembly 14 to the IC chip 12 in the way shown in FIGS. 3 and 4. Furthermore, each holding portion 44 is also C shaped so that the cooling apparatus 10 can be easily clipped or snapped onto the IC chip 12 without removing the IC chip 12 from the printed circuit board to which it is attached.

This is done by first placing the cooling apparatus 10 over the IC chip 12 so that the holding portions 44 rest on the upper surface 40 of the IC chip 12. By then pressing down on the cooling apparatus 10, the holding portions 44 will bend (since the holding portions 44 are made of a flexible material) around the sides 46 of the IC chip and snap into place. As a result, the cooling apparatus 10 is clipped onto the IC chip 12.

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is:

1. An apparatus for cooling an integrated circuit chip comprising:

an air movement device;

means for clipping said air movement device onto an integrated circuit chip;

a plurality of fasteners for fixing said clipping means to said air movement device, each of said fasteners having a trunk fastened to said air movement device and a head that rests on said integrated circuit chip and provides spacing between said air movement device and said integrated circuit chip when said air movement device is clipped onto said integrated circuit chip by said clipping means so that air can be moved over said integrated circuit chip by said air movement device in order to cool said integrated circuit chip.

2. An apparatus as recited in claim 1 wherein said air movement device comprises a fan assembly including a fan having a plurality of fan blades for moving air over said integrated circuit chip.

3. An apparatus as recited in claim 1 wherein:

said integrated circuit chip has an upper surface and a lower surface; and said clipping means includes a plurality of holding portions each shaped for contacting said lower surface of said integrated circuit chip for clipping said air movement device onto said integrated circuit chip over said upper surface of said integrated circuit chip so that air can be moved over said upper surface of said integrated circuit chip by said air movement device.

4. An apparatus as recited in claim 1 wherein:

said integrated circuit chip has an upper surface and a lower surface; and said clipping means including a plurality of mounting clips, each of said mounting clips having a holding portion shaped for contacting said lower surface of said integrated circuit chip for clipping said air movement device onto said integrated circuit chip over said upper surface of said integrated circuit chip so that air can be moved over said upper surface of said integrated circuit chip by said air movement device.

* * * * *